(12) United States Patent
Lozhkin (10) Patent No.: US 8,957,730 B2
(45) Date of Patent: Feb. 17, 2015

(54) SIGNAL PROCESSING APPARATUS AND AMPLIFICATION APPARATUS

(71) Applicant: Fujitsu Limited, Kawasaki-shi, Kanagawa (JP)

(72) Inventor: Alexander Nikolaevich Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 126 days.

(21) Appl. No.: 13/713,838

(22) Filed: Dec. 13, 2012

(65) Prior Publication Data

US 2013/0194038 A1 Aug. 1, 2013

(30) Foreign Application Priority Data

Jan. 27, 2012 (JP) ................................. 2012-015780

(51) Int. Cl.
*H03F 1/26* (2006.01)
*H03F 1/32* (2006.01)
*H03F 3/24* (2006.01)

(52) U.S. Cl.
CPC ............... *H03F 1/32* (2013.01); *H03F 1/3247* (2013.01); *H03F 1/3258* (2013.01); *H03F 1/3294* (2013.01); *H03F 3/24* (2013.01); *H03F 2200/336* (2013.01)

USPC ......... 330/149; 375/296; 375/297; 455/114.3

(58) Field of Classification Search
CPC ..................... H04B 2001/0425; H03F 1/3247
USPC ................. 330/149; 375/296, 297; 455/114.3
See application file for complete search history.

(56) References Cited

U.S. PATENT DOCUMENTS

| | | | |
|---|---|---|---|
| 7,769,103 B2 | 8/2010 | Carichner et al. | |
| 2006/0067424 A1* | 3/2006 | Wolf | 375/296 |

* cited by examiner

*Primary Examiner* — Robert Pascal
*Assistant Examiner* — Khiem Nguyen
(74) *Attorney, Agent, or Firm* — Arent Fox LLP (57) ABSTRACT

A signal processing apparatus includes a corrector that corrects a digital signal in accordance with a correction value, a converter that converts the digital signal corrected by the corrector into an analog signal, a sample-and-hold unit that holds an instantaneous value of the analog signal that has been obtained by the converter and that has been amplified by an amplifier for a certain frequency that is smaller than twice a maximum frequency of the analog signal, a digitizer that converts the instantaneous value held by the sample-and-hold unit into a digital value when the digitizer received an operation clock having the certain frequency, and an updater that updates, on the basis of the digital value obtained by the digitizer, the correction value of the corrector such that the correction value becomes a correction value that reduces nonlinear distortion in the analog signal amplified by the amplifier.

7 Claims, 10 Drawing Sheets

SIGNAL PROCESSING APPARATUS AND AMPLIFICATION APPARATUS

CROSS-REFERENCE TO RELATED APPLICATION(S)

This application is based upon and claims the benefit of priority of the prior Japanese Patent Application No. 2012-15780, filed on Jan. 27, 2012, the entire contents of which are incorporated herein by reference.

FIELD

The embodiments discussed herein are related to a signal processing apparatus and an amplification apparatus.

BACKGROUND

Currently, in wireless transmitters and the like, high-power amplifiers (HPAs) that amplify radio frequency (RF) signals are used. An HPA might be driven in a nonlinear region, in which a relationship between an input level and an output level is nonlinear, in order to increase the amplification efficiency. U.S. Pat. No. 7,769,103 is an example of related art.

The nonlinearity of the HPA generates, in an output signal, a parasitic component having a bandwidth that is, for example, P times (P is a natural number equal to or larger than 2) as large as that of an input signal. For example, the third-order nonlinearity of the HPA generates, in the output signal, a parasitic component having a bandwidth three times as large as that of the input signal. In addition, the fifth-order nonlinearity of the HPA generates, in the output signal, a parasitic component having a bandwidth five times as large as that of the input signal. Thus, the nonlinearity of the HPA generates nonlinear distortion (inter-modulation distortion) such as third-order distortion (IM3) and fifth-order distortion (IM5) inside and outside the band of an RF signal.

Pre-distortion (PD) is a technique in which nonlinear distortion is reduced by linearizing the HPA. In the pre-distortion, nonlinear distortion is compensated by providing the reverse characteristics of the nonlinearity of the HPA for the signal input to the HPA.

In addition, adaptive pre-distortion (APD) is known in which nonlinear distortion is compensated while the output signal of the HPA is being fed back. The adaptive pre-distortion may be, for example, adaptive digital pre-distortion in which pre-compensation of nonlinear distortion is realized by digital processing.

In the adaptive digital pre-distortion, a feedback path that feeds back the output signal of the HPA is provided. Along the feedback path, for example, an analog-to-digital converter (ADC) that converts the output signal of the HPA into a digital signal is provided. As the ADC, for example, a high-speed ADC is used to convert a feedback signal into a digital signal.

However, in the above-described related art, because a high-speed ADC has low bit resolution, a capability to compensate nonlinear distortion in the pre-distortion might be low.

SUMMARY

According to an aspect of the embodiments, an apparatus includes a signal processing apparatus including: a corrector that corrects a digital signal in accordance with a correction value, a converter that converts the digital signal corrected by the corrector into an analog signal, a sample-and-hold unit that holds an instantaneous value of the analog signal that has been obtained as a result of the conversion by the converter and that has been amplified by an amplifier for a certain period corresponding to a certain frequency that is smaller than twice a maximum frequency of the analog signal, a digitizer that converts the instantaneous value held by the sample-and-hold unit into a digital value when the digitizer received an operation clock having the certain frequency, and an updater that updates, on the basis of the digital value obtained as a result of the conversion by the digitizer, the correction value of the corrector such that the correction value becomes a correction value that reduces nonlinear distortion in the analog signal amplified by the amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A signal processing apparatus and an amplification apparatus according to an embodiment of the present disclosure will be described in detail hereinafter with reference to the accompanying drawings.

Embodiment

Figure 1:
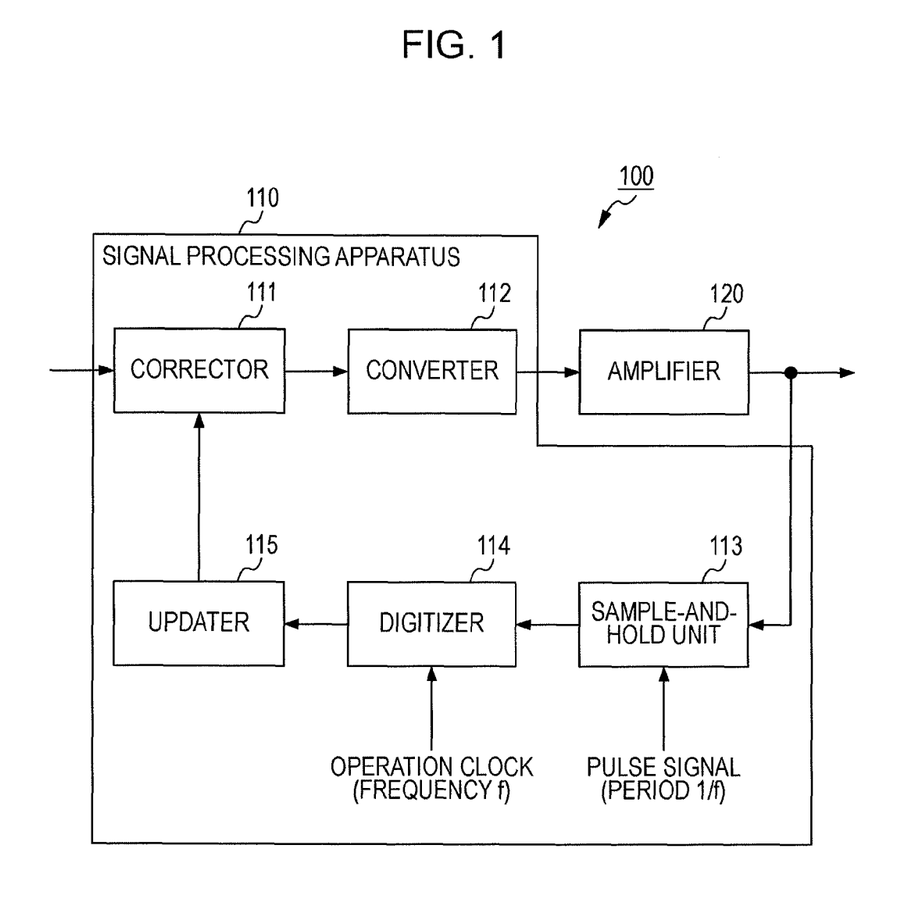
FIG. 1 is a diagram illustrating an example of the configurations of an amplification apparatus and a signal processing apparatus according to an embodiment.

Configurations of Amplification Apparatus and Signal Processing Apparatus According to Embodiment FIG. 1 is a diagram illustrating an example of the configurations of an amplification apparatus and a signal processing apparatus according to the embodiment. As illustrated in FIG. 1, an amplification apparatus 100 according to the embodiment includes a signal processing apparatus 110 and an amplifier 120. The amplifier 120 amplifies and outputs a target signal. The target signal is, for example, a high-frequency signal modulated by orthogonal frequency-division multiplexing (OFDM).

The signal processing apparatus 110 is a predistorter that executes pre-distortion of nonlinear distortion generated in the target signal in the amplifier 120. More specifically, the signal processing apparatus 110 includes a corrector 111, a converter 112, a sample-and-hold unit 113, a digitizer 114, and an updater 115.

A digital signal is inputted to the corrector 111. The corrector 111 corrects the input digital signal using a variable correction value. For example, the corrector 111 executes correction by multiplying the input digital signal by the correction value. The correction value of the corrector 111 is updated by the updater 115. The corrector 111 outputs the corrected digital signal to the converter 112. The converter 112 converts the digital signal output from the corrector 111 into an analog signal. The converter 112 outputs the analog signal obtained by the conversion to the amplifier 120.

The amplifier 120 amplifies the analog signal output from the converter 112. For example, the amplifier 120 is driven in a nonlinear region, in which a relationship between an input level and an output level is nonlinear. The amplifier 120 is, for example, an HPA. In the amplifier 120, nonlinear distortion (inter-modulation distortion) is generated in an analog signal to be amplified. The amplifier 120 outputs the amplified analog signal to a later stage of the amplification apparatus 100. In addition, the analog signal output from the amplifier 120 is also output to the sample-and-hold unit 113.

The sample-and-hold unit 113 holds an instantaneous value (an instantaneous level) of the analog signal output from the amplifier 120 for a certain period. The certain period is, for example, a period 1/f, which corresponds to a certain frequency f smaller than a frequency for capturing the entire bandwidth of the analog signal output from the amplifier 120. The frequency for capturing the entire bandwidth of the analog signal output from the amplifier 120 is, for example, a frequency (a Nyquist frequency) twice as high as a maximum frequency of the analog signal output from the amplifier 120. The sample-and-hold unit 113 outputs the held instantaneous value to the digitizer 114. Therefore, the instantaneous value output from the sample-and-hold unit 113 to the digitizer 114 is updated in the period 1/f.

The digitizer 114 converts the instantaneous value held by the sample-and-hold unit 113 into a digital value using an operation clock having the frequency f. The digitizer 114 outputs the digital value obtained by the conversion into the updater 115. Therefore, the digital value output from the digitizer 114 to the updater 115 is updated in the period 1/f.

The updater 115 updates the correction value of the corrector 111 on the basis of the digital value output from the digitizer 114. More specifically, the updater 115 updates the correction value of the corrector 111 such that the correction value becomes a correction value that compensates the nonlinear distortion of the analog signal in the amplifier 120. For example, the updater 115 obtains the nonlinear distortion of the output signal of the amplifier 120 on the basis of a digital signal obtained by dividing the digital signal input to the corrector 111 and the digital value output from the digitizer 114. The updater 115 then updates the correction value of the corrector 111 such that the nonlinear distortion to be obtained becomes small.

According to the amplification apparatus 100 illustrated in FIG. 1, the sample-and-hold unit 113 can hold an instantaneous value of a feedback signal at low speed (for the period 1/f), and undersampling in which the digitizer 114 is operated at low speed (at the frequency f) can be performed. Therefore, a low-speed digitizer may be used as the digitizer 114 along a feedback path.

In addition, in the pre-distortion, an original digital signal does not have to be recovered by performing digital conversion on the feedback signal. Therefore, the pre-distortion can be performed even when a low-speed digitizer is used as the digitizer 114. Because a low-speed digitizer can have high bit resolution (quantization resolution) (for example, refer to FIG. 7), the bit resolution of the digitizer 114 can be increased and quantization noise can be reduced, thereby improving a signal-to-interference-and-noise ratio (SINR). Therefore, a capability to compensate the nonlinear distortion can be improved.

In addition, because the power consumption of a low-speed digitizer is small, the power consumption in the pre-distortion can be suppressed. In addition, because the manufacturing cost of a low-speed digitizer is low, the manufacturing cost of the amplification apparatus 100 can be suppressed.

In addition, for example, in a configuration in which an anti-aliasing low-pass filter is provided in a previous stage of a low-speed ADC in order to use the ADC along the feedback path, the feedback signal deteriorates due to bandwidth limitation of the low-pass filter. On the other hand, in the amplification apparatus 100, the sample-and-hold unit 113 holds the instantaneous value of the feedback signal at low speed (for the period 1/f). Therefore, the digitizer 114 can be operated at low speed (at the frequency f) even when a low-pass filter is not provided along the feedback path. Therefore, deterioration of the feedback path can be suppressed, and the capability to compensate the nonlinear deterioration can be improved.

Implementation Example of Amplification Apparatus

Figure 2:
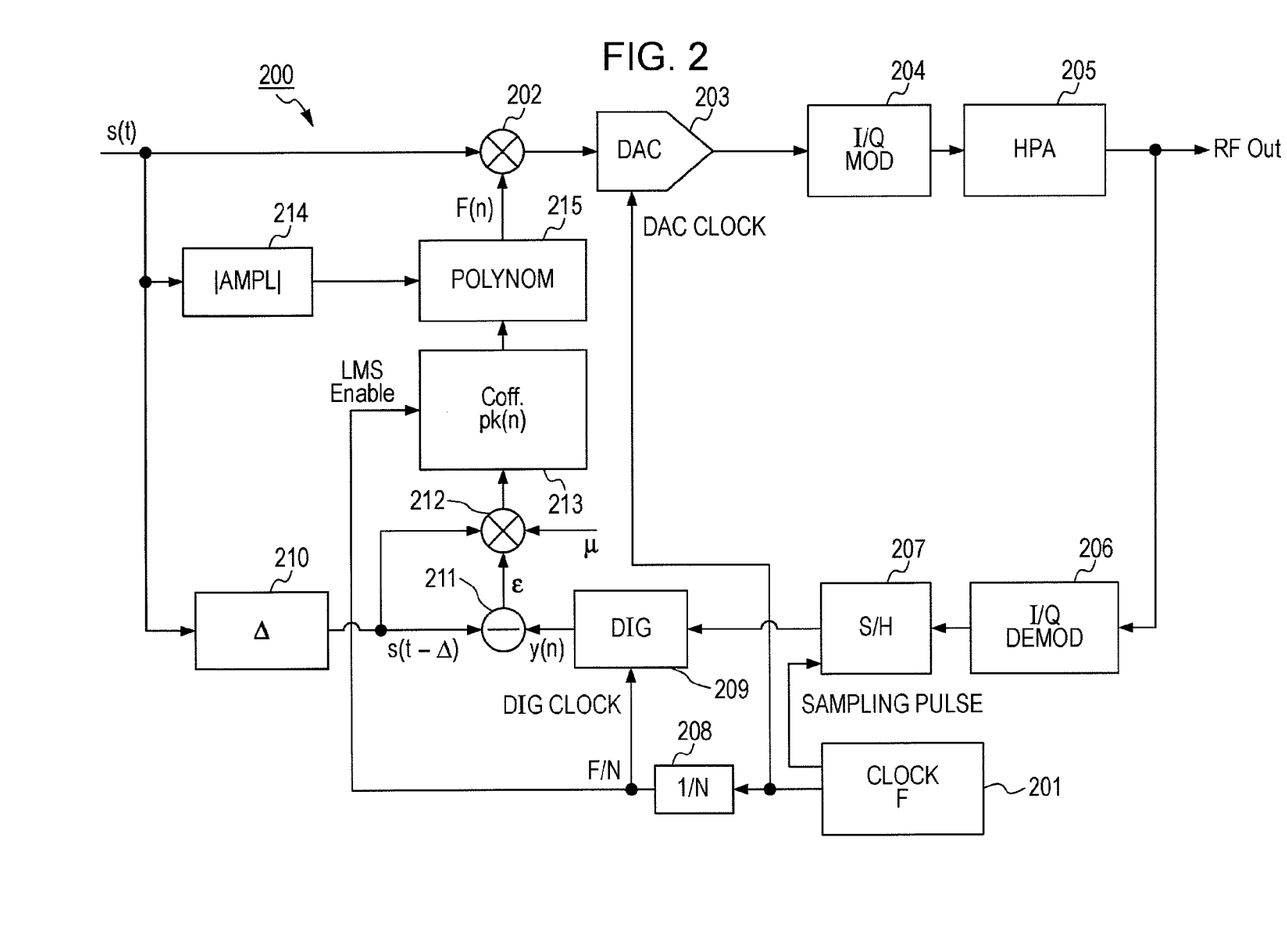
FIG. 2 is a diagram illustrating an implementation example of the amplification apparatus.

FIG. 2 is a diagram illustrating an implementation example of the amplification apparatus. An amplification apparatus 200 illustrated in FIG. 2 is an implementation example of the amplification apparatus 100 illustrated in FIG. 1. The amplification apparatus 200 includes a clock generator 201, a multiplier 202, a digital-to-analog converter (DAC) 203, an in-phase/quadrature-phase (IQ) modulator 204, an HPA 205, an IQ demodulator 206, a sample-and-hold circuit 207, a frequency divider 208, a digitizer 209, a delay unit 210, a subtractor 211, a multiplier 212, a correction value updater 213, an amplitude calculator 214, and a polynomial operator 215.

The corrector 111 illustrated in FIG. 1 may be realized, for example, by the multiplier 202. The converter 112 illustrated in FIG. 1 may be realized, for example, by the DAC 203. The sample-and-hold unit 113 illustrated in FIG. 1 may be realized, for example, by the sample-and-hold unit 207. The digitizer 114 illustrated in FIG. 1 may be realized, for example, by the digitizer 209. The updater 115 illustrated in FIG. 1 may be realized, for example, by the delay unit 210, the subtractor 211, the multiplier 212, the correction value updater 213, the amplitude calculator 214, and the polynomial operator 215. The amplifier 120 illustrated in FIG. 1 may be realized, for example, by the HPA 205.

The clock generator 201 (CLOCK F) generates a DAC clock and outputs the DAC clock to the DAC 203 and the frequency divider 208. The frequency of the DAC clock is denoted by F. In addition, the clock generator 201 generates a sampling pulse and outputs the sampling pulse to the sample-and-hold unit 207. The sampling pulse is, for example, a pulse signal indicating a period N/F, which corresponds to a frequency F/N (N is an integer larger than 1 with or without a decimal). The period of the sampling pulse may be, for example, 50 ns.

A digital input signal s(t) is inputted to the amplification apparatus 200. The input signal s(t) is input to the multiplier 202, the delay unit 210, and the amplitude calculator 214. The multiplier 202 multiplies the input signal s(t) by a correction value F(n) output from the polynomial operator 215. The multiplier 202 outputs the signal multiplied by the correction value F(n) to the DAC 203.

The DAC 203 converts the signal output from the multiplier 202 into an analog signal on the basis of the DAC clock (the frequency F) output from the clock generator 201. The DAC 203 outputs the signal converted into the analog signal to the IQ modulator 204.

For example, when the bandwidth of the analog signal is 100 MHz, the signal output from the DAC 203 has a high sampling clock, namely, for example, a sampling clock of 1 GS/s. The IQ modulator 204 (I/Q MOD) executes IQ modulation on the signal output from the DAC 203. The IQ modulator 204 outputs the signal subjected to the IQ modulation to the HPA 205.

The HPA 205 amplifies the signal output from the IQ modulator 204. The HPA 205 outputs the amplified signal (RF Out) to a later stage of the amplification apparatus 200. In addition, the HPA 205 outputs the amplified signal to the IQ demodulator 206. The signal output from the HPA 205 is, for example, a signal whose bandwidth is P times as large as that of the signal input to the HPA 205 due to nonlinear distortion (inter-modulation distortion).

For example, when the bandwidth of the analog signal is 100 MHz, the bandwidth of the signal output from the HPA 205 is, for example, equal to or larger than 5×100=500 [MHz] due to the nonlinear distortion (inter-modulation distortion). The IQ demodulator 206 (I/Q DEMOD) executes IQ demodulation on the signal output from the HPA 205. The IQ demodulator 206 outputs the demodulated signal to the sample-and-hold unit 207.

The sample-and-hold unit 207 (S/H) samples the amplitude of the signal output from the IQ demodulator 206 at the timing (in the period N/F) of the sampling pulse from the clock generator 201. The sample-and-hold unit 207 then holds the sampled signal until the timing of a next sampling pulse from the clock generator 201. It is to be noted that since the signal output from the IQ demodulator 206 to the sample-and-hold unit 207 has not passed through, for example, a low-pass filter (LPF), the bandwidth of the signal is not limited and accordingly large.

The sample-and-hold unit 207 outputs the held signal to the digitizer 209. Therefore, the signal output from the sample-and-hold unit 207 to the digitizer 209 is updated at the timing of the sampling pulse from the clock generator 201.

The frequency divider 208 (1/N) is a frequency divider that divides the frequency of the DAC clock output from the clock generator 201 into 1/N. The frequency divider 208 outputs the divided clock to the digitizer 209 as a DIG clock indicating the timing of digital conversion. In addition, the frequency divider 208 outputs the divided clock to the correction value updater 213 as an update signal (LMS Enable) indicating a timing at which a process for updating a coefficient pk(n) is performed. Therefore, the frequencies of the DIG clock and the update signal (LMS Enable) are F/N. For example, a frequency divider of a prescaler type or a phase-locked loop (PLL) type may be used as the frequency divider 208.

The digitizer 209 converts the signal output from the sample-and-hold unit 207 into a digital signal using the DIG clock output from the frequency divider 208. Therefore, the digitizer 209 operates at a speed of the frequency F/N, which is 1/N of the frequency at which the DAC 203 operates. For example, when the period of the sampling pulse is 50 ns, the digitizer 209 can operate using a low clock frequency, namely, for example, 20 MHz. The digitizer 209 outputs a signal y(n) converted into the digital signal to the subtractor 211. For example, a low-speed ADC may be used as the digitizer 209.

The delay unit 210 delays the input signal s(t) by an amount of delay $\Delta$ and outputs a delayed input signal s(t−$\Delta$) to the subtractor 211 and the multiplier 212. The subtractor 211 subtracts the signal y(n) output from the digitizer 209 from the input signal s(t−$\Delta$) output from the delay unit 210 and outputs a signal $\epsilon$ (=s(t−$\Delta$)−y(n)=s(n)−y(n)), which is a result of the subtraction, to the multiplier 212. The signal $\epsilon$ is a signal indicating the nonlinear characteristics of the HPA 205.

The multiplier 212 multiplies the signal $\epsilon$ output from the subtractor 211, the input signal s(t−$\Delta$)=s(n), and a coefficient $\mu$ together. The multiplier 212 outputs a signal $\mu \cdot s(n) \cdot \epsilon(n)$ to the correction value updater 213.

The correction value updater 213 (Coll. pk(n)) outputs the coefficient pk(n) to the polynomial operator 215. In addition, the correction value updater 213 updates the coefficient pk(n) to be output to the polynomial operator 215 at the timing indicated by the DIG clock output from the frequency divider 208. More specifically, the correction value updater 213 calculates the coefficient pk(n) based on the signal $\mu \cdot s(n) \cdot \epsilon(n)$ output from the multiplier 212 at each timing of the frequency F/N indicated by the update signal (LMS Enable) output from the frequency divider 208.

For example, the correction value updater 213 calculates the coefficient pk(n) using the following expression (1). The correction value updater 213 outputs the calculated coefficient pk(n) to the polynomial operator 215. Thus, the coefficient pk(n) to be output to the polynomial operator 215 can be updated in the period in which the signal y(n) output from the digitizer 209 is updated.

$$pk(n)=pk(n-1)+\mu \cdot s(n) \cdot \epsilon(n) \tag{1}$$

The amplitude calculator 214 obtains an amplitude |s(t)| of the input signal s(t) and outputs the obtained amplitude to the polynomial operator 215 as an amplitude |s(n)|. The polynomial operator 215 (Polynom) calculates the correction value F(n) on the basis of the coefficient pk(n) output from the correction value updater 213 and the amplitude |s(n)| output from the amplitude calculator 214. The correction value F(n) is, for example, a correction value indicating the reverse characteristics of the nonlinear characteristics generated in the input signal s(t) in the HPA 205.

For example, the polynomial operator 215 calculates the correction value F(n) through k-th-order polynomial operation indicated as the following expression (2). The polynomial operator 215 outputs the calculated correction value F(n) to the multiplier 202. Because the coefficient pk(n) output from the correction value updater 213 is updated in the period N/F, the polynomial operation by the polynomial operator 215 can be performed in the period N/F.

Thus, by performing the process for updating the correction value F(n) in the period N/F in which the signal y(n) output from the digitizer 209 is updated, it can be avoided that the process for updating the correction value F(n) is performed while the signal y(n) is not updated. Therefore, the amount of processing of the update of the correction value F(n) can be reduced.

$$F(n)=p1+p2|s(n)-+p3|s(n)|^2+p4|s(n)|^3+\ldots+pk|s(n)|^{k-1} \tag{2}$$

Thus, the amplification apparatus 200 executes pre-distortion adopting a least mean square (LMS) algorithm in which the coefficient pk(n) of the correction value F(n) in the polynomial operator 215 is adjusted by the correction value updater 213.

Clock Signals and Sampling Pulse

Figure 3:
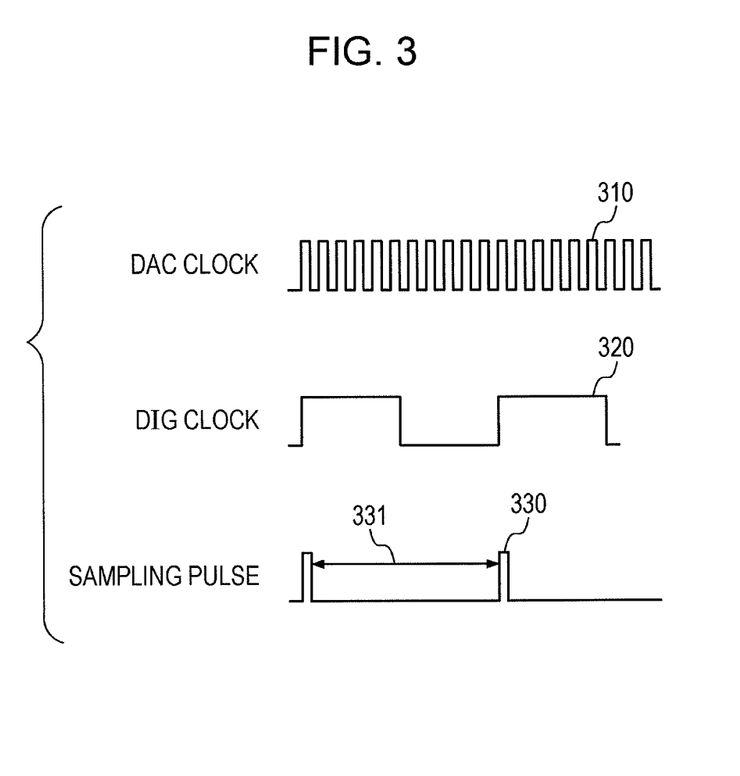
FIG. 3 is a diagram illustrating an example of clock signals and a sample pulse.

FIG. 3 is a diagram illustrating an example of the clock signals and the sampling pulse. In FIG. 3, the horizontal axis represents time, and the vertical axis direction represents signal intensity. A DAC clock 310 indicates a DAC clock output from the clock generator 201 to the DAC 203. A DIG clock 320 indicates a DIG clock output from the frequency divider 208 to the digitizer 209. The DIG clock 320 has a frequency that is one-eleventh of the frequency of the DAC clock 310 as a result of the division by the frequency divider 208 (N=11).

A sampling pulse 330 indicates a sampling pulse input from the clock generator 201 to the sample-and-hold unit 207. A pulse period 331 of the sampling pulse 330 is N times as long as the period of the DAC clock 310.

Input/Output Signals of Sample-and-Hold Circuit

Figure 4:
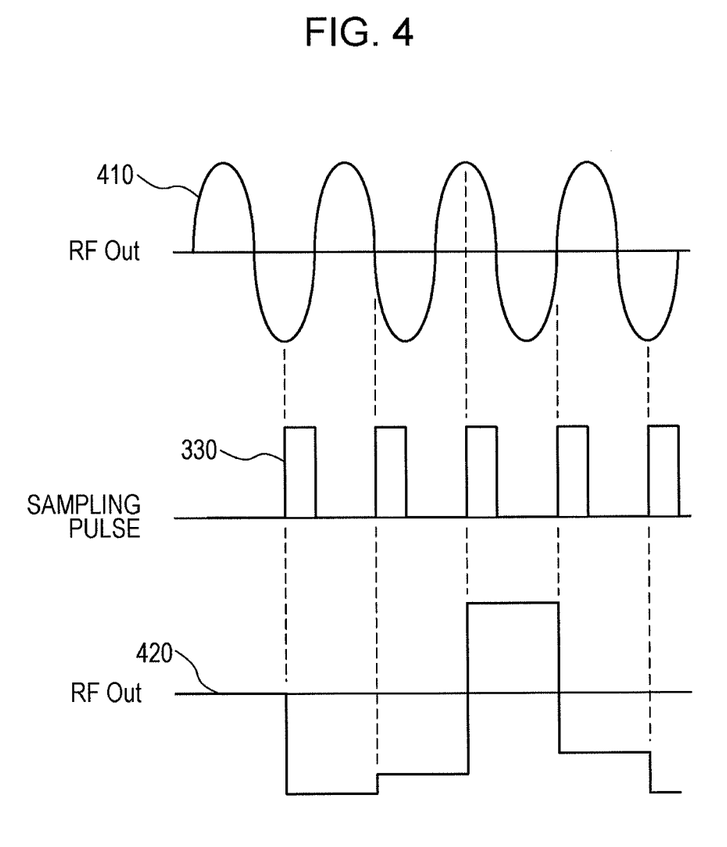
FIG. 4 is a diagram illustrating an example of input/output signals of a sample-and-hold circuit.

FIG. 4 is a diagram illustrating an example of input/output signals of the sample-and-hold unit. In FIG. 4, the horizontal axis represents time, and the vertical axis direction represents signal intensity. In addition, in FIG. 4, the same component as that illustrated in FIG. 3 is given the same reference numeral, and description thereof is omitted. An input signal 410 indicates a signal input from the IQ demodulator 206 to the sample-and-hold unit 207. Here, the input signal 410 is assumed to be a sine wave.

An output signal 420 indicates a signal output from the sample-and-hold unit 207 at a time when it is assumed that the input signal 410 has been input to the sample-and-hold unit 207. As illustrated in FIG. 4, a frequency at which the sample-and-hold unit 207 executes the holding and the sampling may be lower than twice the frequency of the output signal 420.

Example of Sampling

Figure 5A:
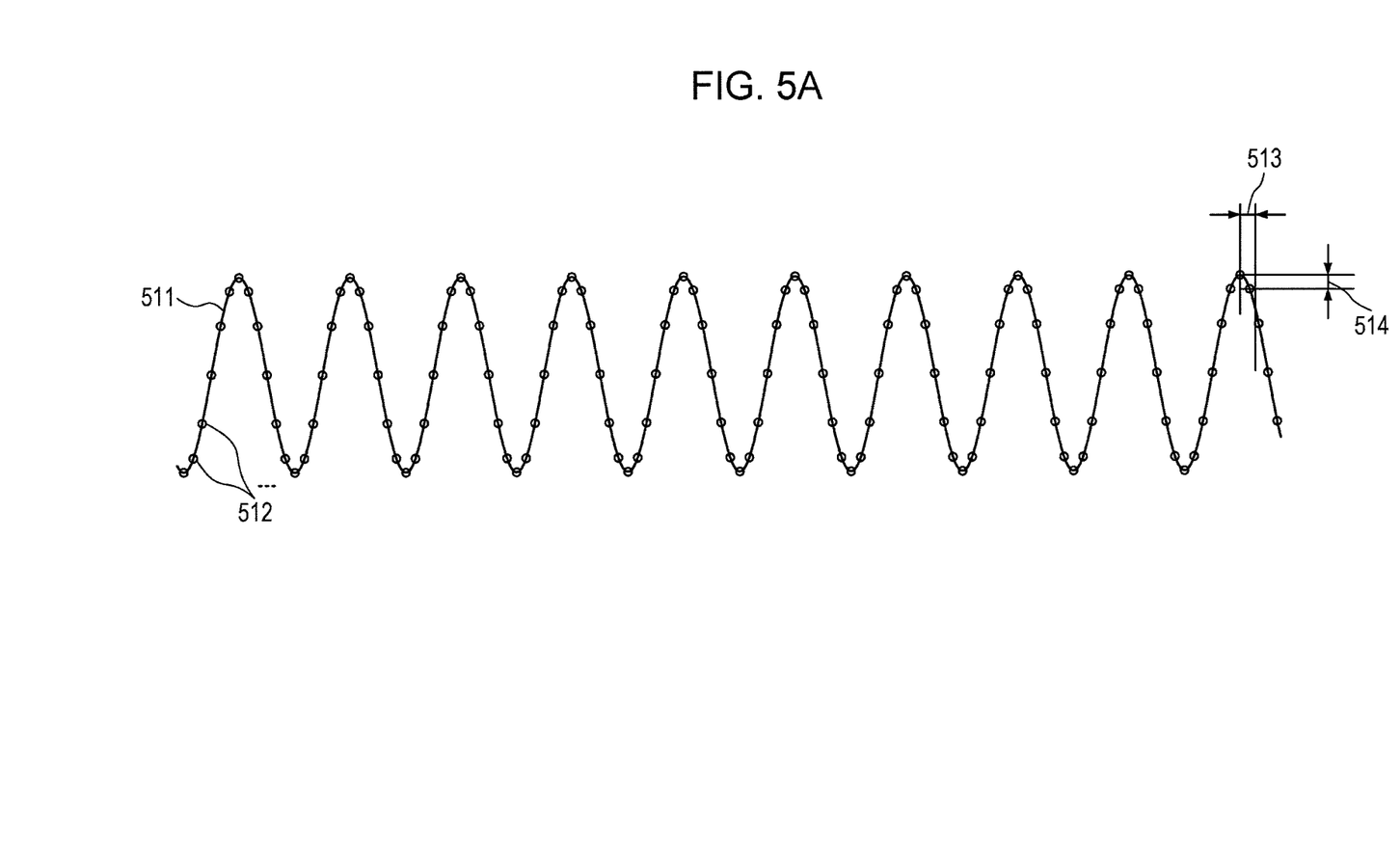
FIG. 5A is a diagram (first) illustrating an example of sampling.
Figure 5B:
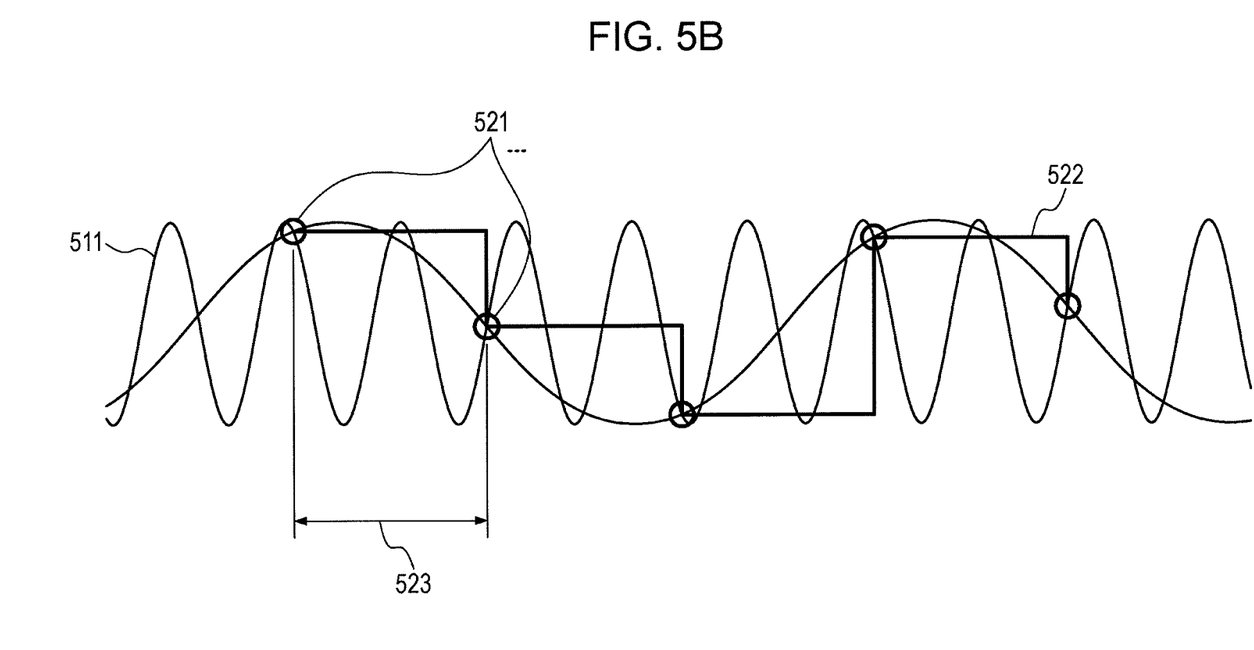
FIG. 5B is a diagram (second) illustrating the example of sampling.

FIG. 5A and FIG. 5B are diagrams illustrating an example of the sampling. In FIG. 5A and FIG. 5B, the horizontal axis represents time, and the vertical axis direction represents signal intensity. An analog signal 511 illustrated in FIG. 5A and FIG. 5B indicates an analog signal input to the sample-and-hold unit 207.

Sampling points 512 illustrated in FIG. 5A indicate sampling points at a time when it is assumed that the analog signal 511 has been sampled at a sufficiently high rate (for example, the frequency F) by the sample-and-hold unit 207 and the digitizer 209. A conversion period 513 is the intervals of the sampling points 512 and indicates a period in which the digitizer 209 converts a signal from the sample-and-hold unit 207 into a digital value by the digitizer 209. Since the sampling rate is high, the conversion period 513 is short, and an amount of variation 514 in the analog signal 511 between the beginning and the end of the conversion period 513 is small.

Sampling points 521 illustrated in FIG. 5B indicate sampling points at a time when the analog signal 511 has been sampled at a row rate (for example, the frequency F/N) by the sample-and-hold unit 207 and the digitizer 209. A holding signal 522 indicates a signal held by the sample-and-hold unit 207 and output to the digitizer 209. A conversion period 523 is the intervals of the sampling points 521 and indicates a period in which the digitizer 209 converts a signal from the sample-and-hold unit 207 into a digital value by the digitizer 209.

In the amplification apparatus 200, since the sampling rate in the sample-and-hold unit 207 and the digitizer 209 is low, the conversion period 523 is long, and accordingly the bit resolution of the digitizer 209 can be increased.

Spectra of Output Signals of HPA

Figure 6:
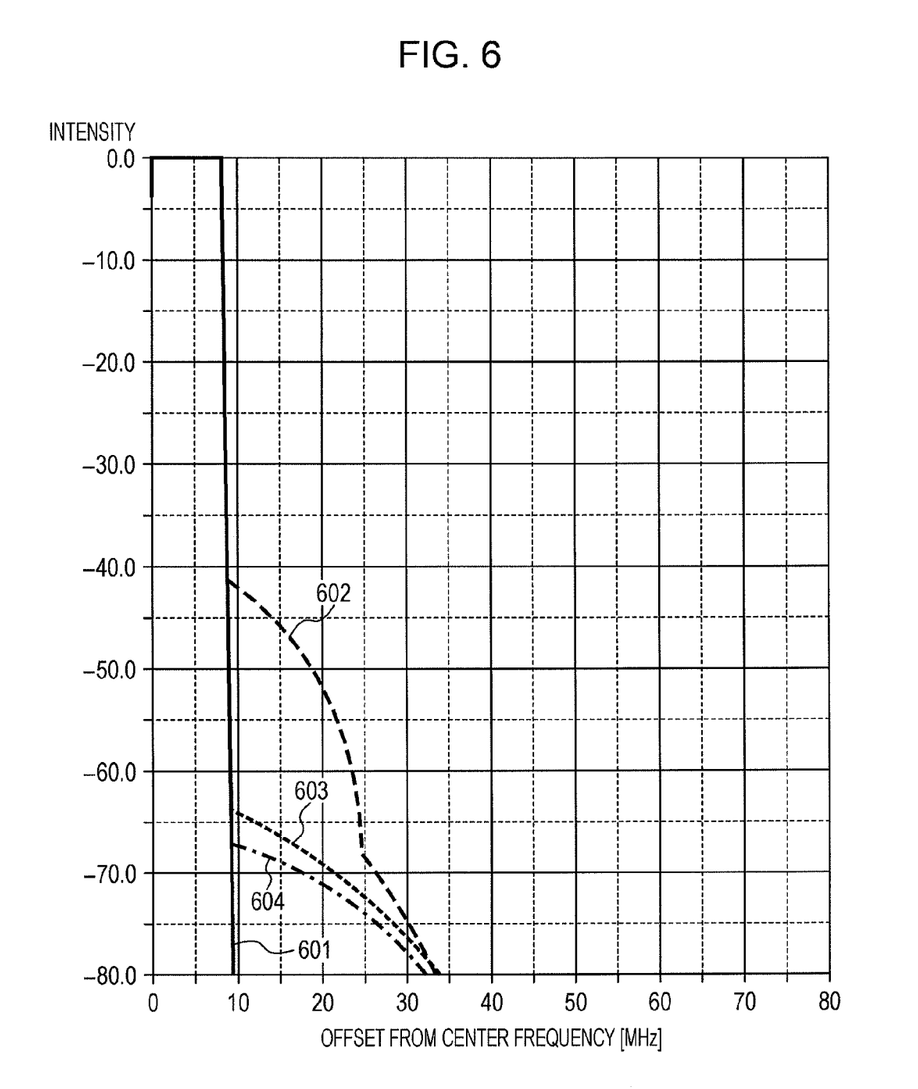
FIG. 6 is a diagram illustrating an example of the spectra of output signals of an HPA.

FIG. 6 is a diagram illustrating an example of the spectra of output signals of the HPA. In FIG. 6, the horizontal axis represents an offset [MHz] of a signal output from the HPA 205 from a central wavelength, and the vertical axis direction represents signal intensity. Here, the bit resolution of the digitizer 209 is assumed to be the same as the bit resolution of a high-speed ADC. In addition, the operation rate of the digitizer 209 is assumed to be 1/10 of a high-speed ADC (or the DAC 203) (N=10). In addition, a signal to be amplified by the HPA 205 is assumed to be a signal modulated by OFDM.

A spectrum 601 is the spectrum of a signal before amplification by the HPA 205. A spectrum 602 is the spectrum of a signal output from the HPA 205 at a time when it is assumed that the pre-distortion is not performed. As indicated by the spectrum 602, significant nonlinear distortion is generated in the HPA 205 when the pre-distortion is not performed.

A spectrum 603 is the spectrum of a signal output from the HPA 205 at a time when it is assumed that a high-speed ADC is provided instead of the sample-and-hold unit 207 and the digitizer 209. A spectrum 604 is the spectrum of a signal output from the HPA 205 in the amplification apparatus 200 that includes the sample-and-hold unit 207 and the digitizer 209. As indicated by the spectra 603 and 604, according to the amplification apparatus 200 that includes the low-speed sample-and-hold unit 207 and the low-speed digitizer 209, the nonlinear distortion generated in the HPA 205 can be suppressed as in the case of providing a high-speed ADC.

In addition, since the bit resolution can be increased in the amplification apparatus 200 by using the low-speed digitizer 209, the quantization noise can be reduced and the SINR can be improved. Therefore, the capability to compensate the nonlinear distortion can be further improved.

Relationship between Sampling Rate and Resolution in Digitizer

Figure 7:
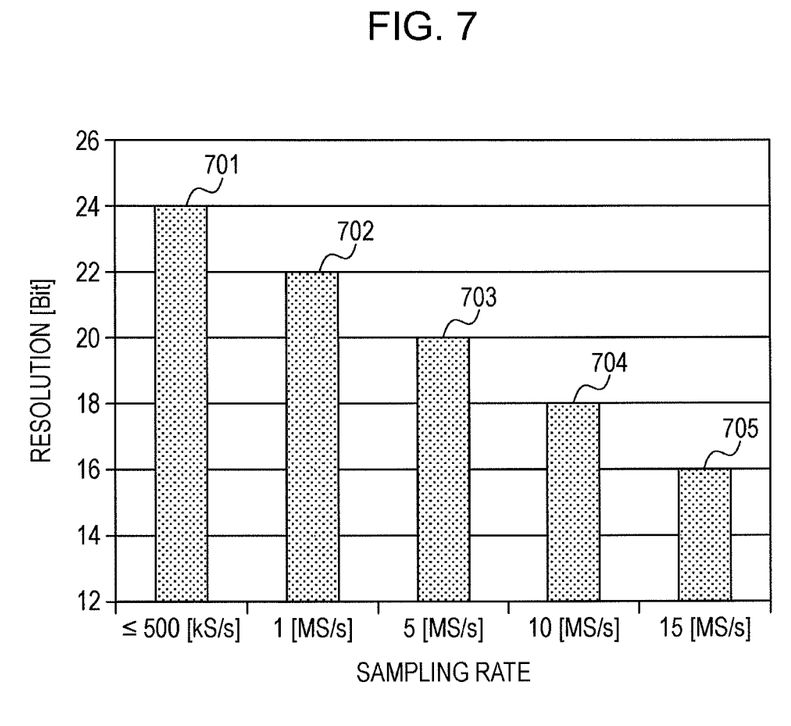
FIG. 7 is a diagram illustrating an example of a relationship between a sampling rate and resolution in a digitizer.

FIG. 7 is a diagram illustrating an example of a relationship between the sampling rate and the resolution in a digitizer. In FIG. 7, the horizontal axis represents the sampling rate of a digitizer (for example, the digitizer 209). The vertical axis represents the resolution [Bit] (bit resolution) of the digitizer. As indicated by values of resolution 701 to 705, the resolution of the digitizer becomes lower as the sampling rate of the digitizer becomes higher. In addition, since the digitizer 209 whose sampling rate is low can be used in the amplification apparatus 200, high resolution can be realized in the digitizer 209.

Amplification Apparatus According To Modification

Figure 8:
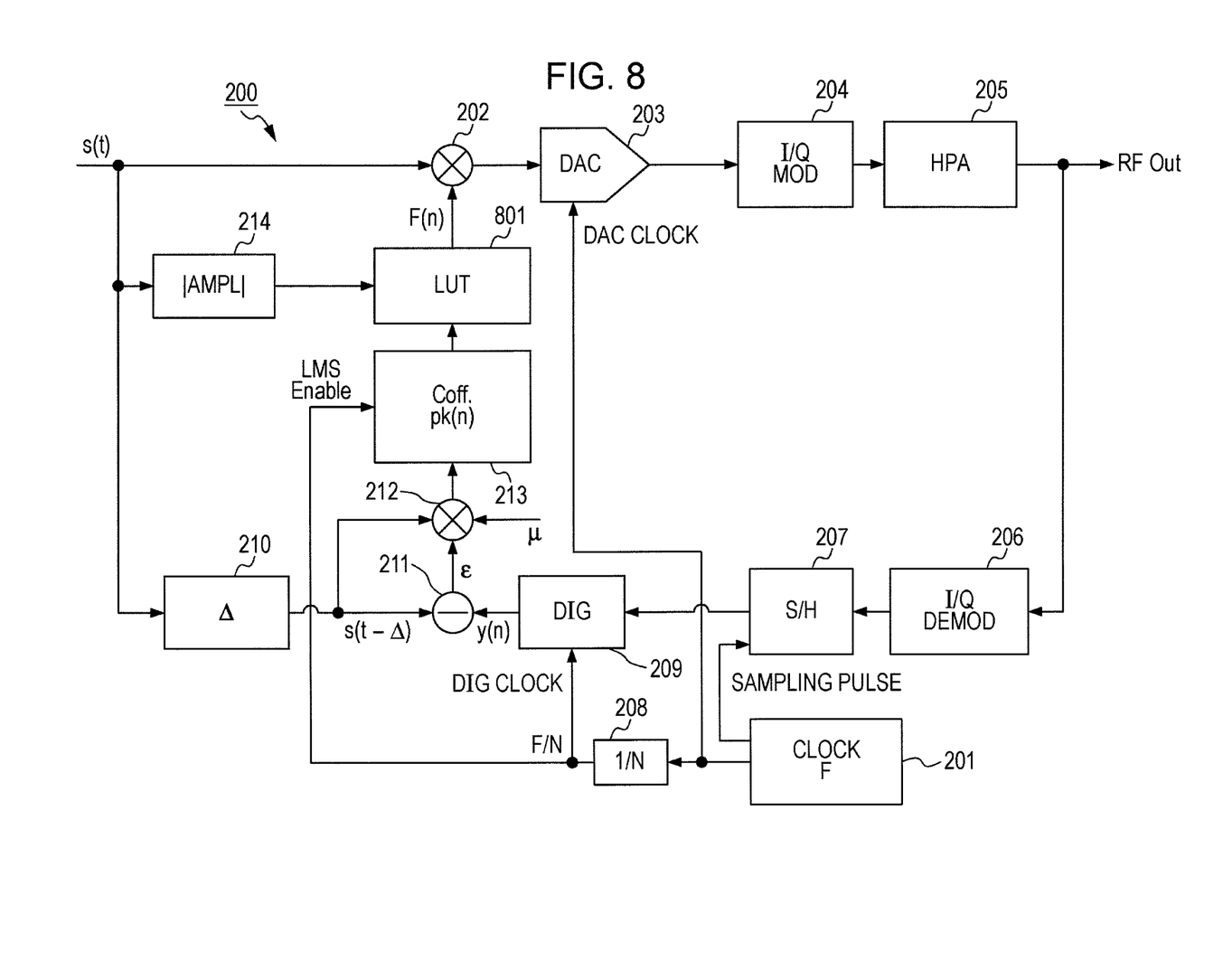
FIG. 8 is a diagram illustrating an amplification apparatus according to a modification.

FIG. 8 is a diagram illustrating an amplification apparatus according to a modification. In FIG. 8, the same components as those illustrated in FIG. 2 are given the same reference numerals, and description thereof is omitted. As illustrated in FIG. 8, the amplification apparatus 200 may include a lookup table (LUT) management unit 801 instead of the polynomial operator 215 illustrated in FIG. 2. The LUT management unit 801 stores a LUT that associates combinations between coefficients pk(n) and amplitudes |s(n)| and results of calculation of the correction value F(n) obtained through the polynomial operation indicated as the expression (2) with each other.

The LUT management unit 801 obtains a correction value F(n) corresponding to a combination between the coefficient pk(n) output from the correction value updater 213 and the amplitude |s(n)| output from the amplitude calculator 214, and outputs the obtained correction value F(n) to the multiplier 202. Thus, the amount of processing of the update of the correction value F(n) can be reduced.

Hardware Configuration of Amplification Apparatus

Figure 9:
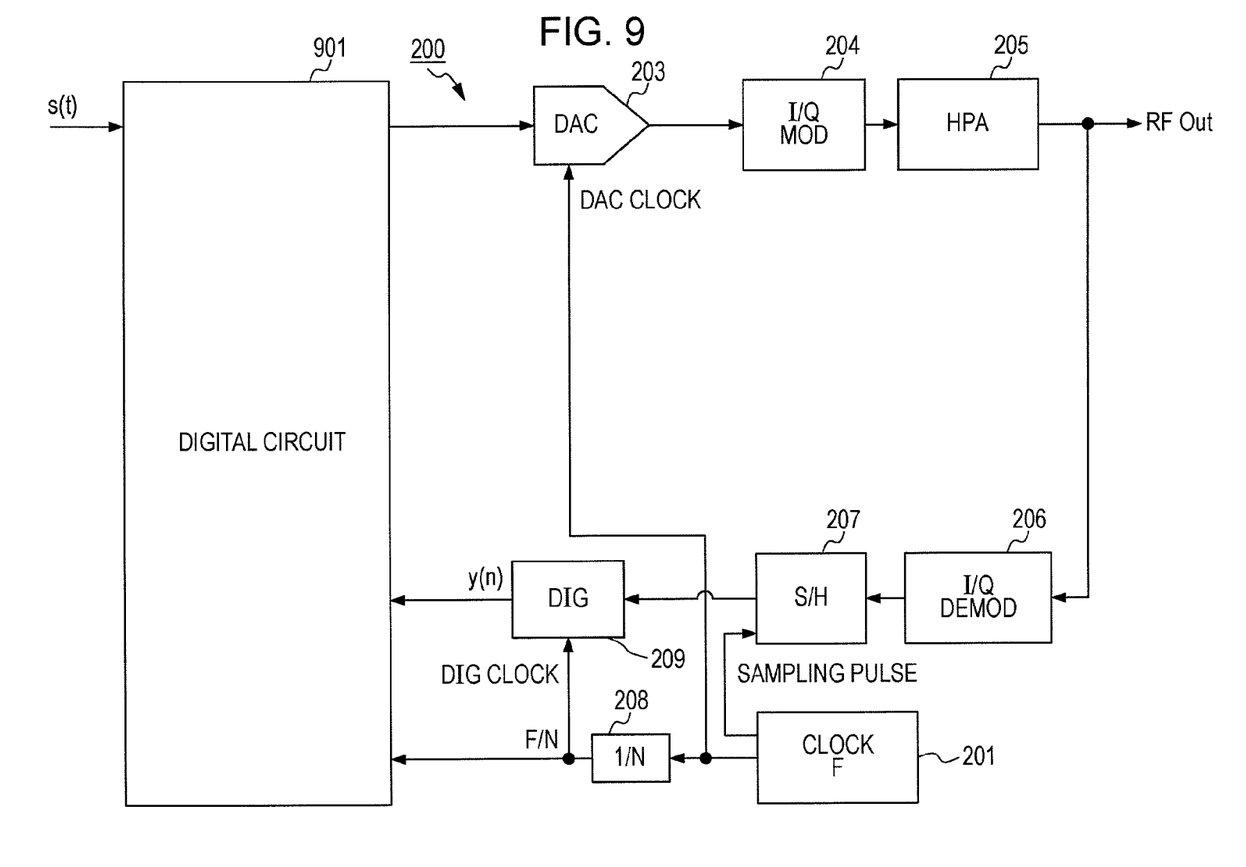
FIG. 9 is a diagram illustrating an example of the hardware configuration of the amplification apparatus.

FIG. 9 is a diagram illustrating an example of the hardware configuration of the amplification apparatus 200. In FIG. 9, the same components as those illustrated in FIG. 2 or FIG. 8 are given the same reference numerals, and description thereof is omitted. As illustrated in FIG. 9, the multiplier 202, the delay unit 210, the subtractor 211, the multiplier 212, the correction value updater 213, the amplitude calculator 214, and the polynomial operator 215 may be realized, for example, by a digital circuit 901.

In addition, the multiplier 202, the delay unit 210, the subtractor 211, the multiplier 212, the correction value updater 213, the amplitude calculator 214, and the LUT management unit 801 illustrated in FIG. 8 may be realized, for example, by the digital circuit 901. In addition, the frequency divider 208 may be realized by the digital circuit 901. The digital circuit 901 may be realized, for example, a digital signal processor (DSP) or a field-programmable gate array (FPGA).

As described above, according to the signal processing apparatus and the amplification apparatus, by adopting a configuration in which undersampling is performed on the output signal of the amplifier in the pre-distortion, a low-speed high-resolution digitizer can be used along the feedback path. Therefore, the nonlinear distortion can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal processing apparatus, comprising:
a corrector that corrects a digital signal in accordance with a correction value;
a converter that converts the digital signal corrected by the corrector into an analog signal;
a sample-and-hold unit that samples and holds an instantaneous value of the analog signal that has been obtained as a result of the conversion by the converter and that has been amplified by an amplifier at a certain frequency that is smaller than twice a maximum frequency of the analog signal;
a digitizer that converts the instantaneous value held by the sample-and-hold unit into a digital value when the digitizer received an operation clock having the certain frequency; and
an updater that updates, on the basis of the digital value obtained as a result of the conversion by the digitizer, the correction value of the corrector such that the correction value becomes a correction value that reduces nonlinear distortion in the analog signal amplified by the amplifier.

2. The signal processing apparatus according to claim 1, further comprising:
a generator that generates a clock signal; and
a frequency divider that generates the operation clock by dividing the clock signal generated by the generator,
wherein the converter converts the digital signal into an analog signal on the basis of the clock signal generated by the generator, and
wherein the digitizer converts the instantaneous value into a digital value when the digitizer received the operation clock generated by the frequency divider.

3. The signal processing apparatus according to claim 1,
wherein the updater executes a process for updating the correction value in the certain period on the basis of an operation clock having the certain frequency.

4. The signal processing apparatus according to claim 1, further comprising:
a modulator that modulates the analog signal obtained as a result of the conversion by the converter and that inputs the modulated analog signal to the amplifier; and
a demodulator that demodulates the analog signal amplified by the amplifier,
wherein the sample-and-hold unit holds an instantaneous value of the analog signal demodulated by the demodulator.

5. An amplification apparatus, comprising:
a corrector that corrects a digital signal in accordance with a correction value;
a converter that converts the digital signal corrected by the corrector into an analog signal;
an amplifier that amplifies the analog signal obtained as a result of the conversion by the converter;
a sample-and-hold unit that samples and holds an instantaneous value of the analog signal amplified by the amplifier at a certain frequency that is smaller than twice a maximum frequency of the analog signal;
a digitizer that converts the instantaneous value held by the sample-and-hold unit into a digital value when the digitizer received an operation clock having the certain frequency; and
an updater that updates, on the basis of the digital value obtained as a result of the conversion by the digitizer, the correction value of the corrector such that the correction value becomes a correction value that reduces nonlinear distortion of the analog signal amplified by the amplifier.

6. The amplification apparatus according to claim 5,
wherein the amplifier is a high-power amplifier driven in a region in which a relationship between an input level and an output level is nonlinear.

7. The amplification apparatus according to claim 5,
wherein the amplifier amplifies the analog signal modulated by orthogonal frequency-division multiplexing.

\* \* \* \* \*